United States Patent [19]

Isfeld et al.

[11] Patent Number: 5,043,670

[45] Date of Patent: Aug. 27, 1991

[54] BLOCK HEATER TESTER

[76] Inventors: Rodney H. Isfeld, Box 1894, Gimli, Manitoba, Canada, R0C 1B0; Brian L. McDougall, Box 169, Garson, Manitoba, Canada, R0E 0R0

[21] Appl. No.: 428,991

[22] Filed: Oct. 30, 1989

[51] Int. Cl.[5] ...................... G08B 21/00; G01R 31/00
[52] U.S. Cl. ................................... 324/508; 324/556; 340/655; 340/656
[58] Field of Search ............... 340/652, 654, 655, 656; 324/508, 133, 556

[56] References Cited

U.S. PATENT DOCUMENTS

| | | | |
|---|---|---|---|
| 3,733,576 | 5/1973 | Cooper | 324/508 |
| 3,836,844 | 9/1974 | Prugh | 324/133 |
| 3,857,096 | 12/1974 | Gregory | 324/133 |
| 3,962,630 | 6/1976 | Chafee | 324/133 |
| 4,843,514 | 6/1989 | Bodkin | 324/133 |

FOREIGN PATENT DOCUMENTS

| | | | |
|---|---|---|---|
| 652423 | 11/1962 | Canada | 324/508 |
| 1176273 | 8/1964 | Fed. Rep. of Germany | 324/133 |

Primary Examiner—Kenneth Wieder
Assistant Examiner—Jose M. Solis
Attorney, Agent, or Firm—Murray E. Thrift; Stanley G. Ade; Adrian D. Battison

[57] ABSTRACT

A circuit tester indicates the presence of power at an outlet and the continuity of a resistive load connected to the outlet. The tester is particularly useful as an automotive block heater circuit tester. The tester has a housing with a male end equipped with the prongs conventionally found on a male electrical plug and a female end with a socket of the same configuration as a conventional female electrical outlet. One of the sockets is divided into inner and outer terminals that are sequentially engaged by the mating prong of a male plug as it is inserted into the female end of the tester. A lamp and a resistive circuit are connected into this structure in such a way that when the tester is plugged into a live outlet, the lamp is illuminated brightly. When a male plug is inserted into the female end of the tester, the lamp initially dims to confirm continuity of the load and then brightens as the male plug is fully seated in the socket.

9 Claims, 1 Drawing Sheet

U.S. Patent      Aug. 27, 1991      5,043,670
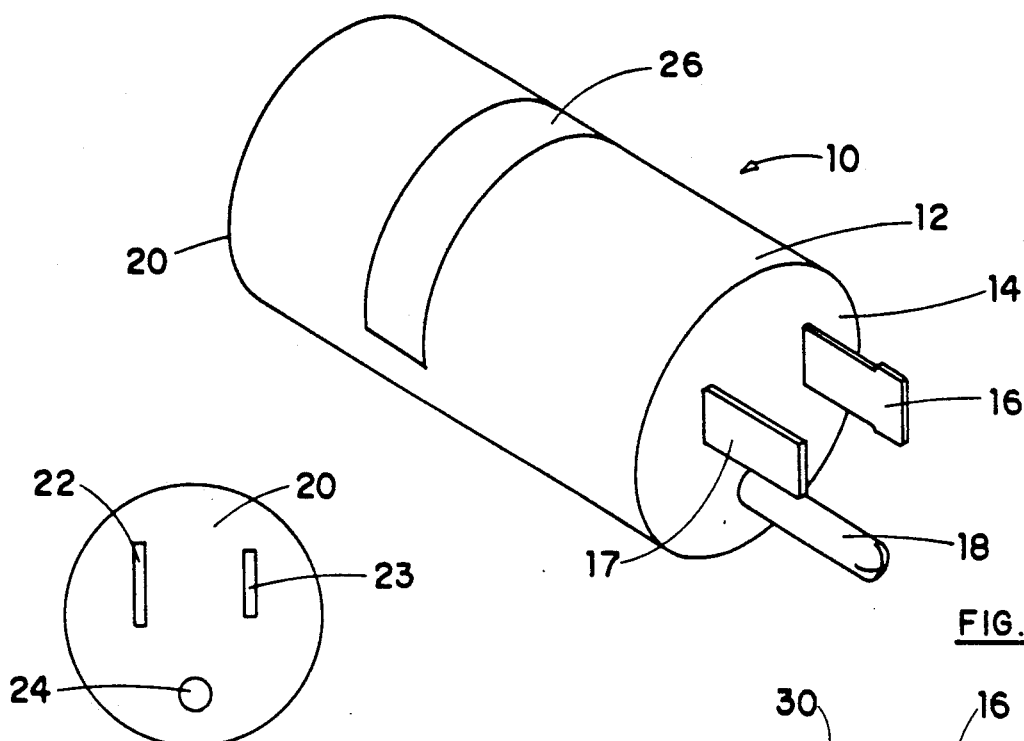
FIG.1
FIG.2
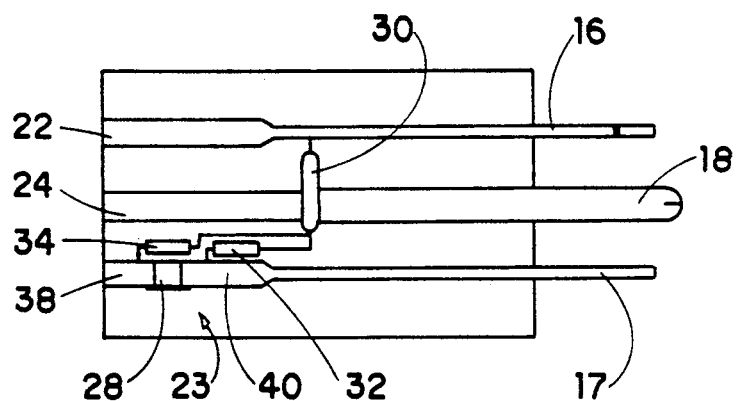
FIG.3
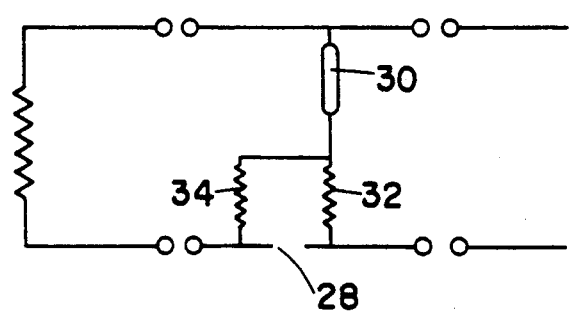
FIG.4

BLOCK HEATER TESTER

FIELD OF THE INVENTION

The present invention relates to electric circuit testers and more particularly to a circuit tester for indicating both the presence of power at an outlet and the continuity of a resistive load, especially an automotive block heater, connected to the outlet.

BACKGROUND

In cold climates, it is common to keep the internal combustion engine of an automobile or the like at a sufficiently high temperature to enable easy starting through the use of an electrical engine block heater. It sometimes occurs that electrical outlets used for this purpose are defective, or the heater itself is defective. In either case, it is desirable to provide a circuit tester for indicating the fault so that it can be corrected.

The testers that are no available commercially for this purpose are relatively complex and quite expensive.

It is the aim of the present invention to provide a simple, effective and relatively inexpensive tester for electrical outlets and resistive loads such as block heaters.

SUMMARY

According to the present invention there is provided a tester for an electrical outlet and a resistive load to be coupled thereto, said tester comprising:

first terminal means for connection to a first terminal of the outlet and a first terminal of the load;

second terminal means having a first terminal part for connection to a second terminal of the outlet and a second terminal of the load, and a second terminal part for connection to the second terminal of the load, the first and second terminal parts being positioned for sequential engagement of the second terminal part and then the first terminal part with the second terminal of the load as the load is coupled to the tester;

first and second resistive means connected in series between the first and second terminal parts of the second terminal means; and indicator lamp means connected between the first and second resistors and to the first terminal means.

The circuit tester is conveniently made as a housing with prongs arranged to be plugged into a conventional electrical outlet. This may be two flat prongs or a combination of two flat and one round or C-shaped prong, the round or C-shaped prong being used for grounding purposes. At the other end of the housing is a conventional female electrical socket arrangement. The tester can then be plugged into the electrical outlet and the voltage across the lamp and a first resistor illuminates the lamp. When a male plug is inserted into the socket end of the device, it initially connects the resistive load and the second resistor in series with the first resistor, leaving the lamp connected in parallel with the load and the second resistor. This divides the voltage applied to the lamp causing it to dim or, where the resistances are appropriate, to go out completely. This indicates the continuity of the resistive load. When the male plug is fully seated, it connects the two resistors in parallel so that the lamp again glows brightly.

BRIEF DESCRIPTION OF THE DRAWINGS

In the accompanying drawings which illustrate an exemplary embodiment of the present invention:

FIG. 1 is an isometric view of a tester according to the present invention;

FIG. 2 is an elevation of the socket end of the tester;

FIG. 3 is a sectional view showing the internal configuration of the tester; and FIG. 4 is an electrical schematic of the tester.

DETAILED DESCRIPTION

Referring to the drawings, FIGS. 1, 2 and 3 illustrate a circuit tester 10 having a housing 12 of an electrically insulating, waterproof material. The housing has a male end 14 from which project two blade-like prongs 16 and 17 and a cylindrical ground prong 18. The opposite end of the housing is a female end 20 that carries two sockets 22 and 23 for receiving prongs like prongs 16 and 17 and a third socket 24 for receiving a ground prong like prong 18. The array of prongs at the male end 14 matches that of a conventional male electrical plug, and at the female end the sockets are in the same array as those of a conventional female electrical outlet.

The housing is also provided with a window 26 midway between the male and female ends.

Referring particularly to FIG. 3, it will be noted that the prong 16 is electrically connected directly to the socket 22. Similarly, the ground prong 18 is electrically connected directly to the ground socket 24. The prong 17 is electrically connected to the socket 23, but the socket 23 has an electrical break 28 between its ends. This provides the socket 23 with an outer terminal part 38 adjacent the female end of the housing and an inner terminal part 40 spaced inwardly from the outer terminal part.

A lamp 30 is located within the housing 12 and positioned so that when the lamp is illuminated, its light can be seen through the window 26. The lamp is connected to the combined terminal consisting of prong 16 and socket 22. It is also connected to resistors 32 and 34. The resistor 32 is in turn connected to the prong 17 and inner terminal part 40 assembly, while the resistor 34 is connected to the outer terminal part 38. The lamp 30 is a neon lamp with a very high resistance while the two resistors 32 and 34 have the same, significantly lower, resistance.

In the use of the tester, the male end is plugged into an electrical outlet. If power is present at the outlet, a voltage will be applied across the prongs 16 and 17 and thus across lamp 30 and resistor 32. This causes the lamp to glow.

When a resistive load is connected to the tester with a male plug, one of the prongs of the male plug will be connected to the socket 22, while the other will initially connect with the outer terminal part 38 of the prong 17 and socket 23 assembly. This applies a voltage across a circuit consisting of resistors 32 and 34 and load resistance 36, all connected in series. This acts as a voltage divider to reduce the voltage across the lamp 30 so that it becomes significantly dimmer or even goes out. This indicates the continuity of the resistive load 36. If there is an open circuit in the load, the lamp will not dim.

When the male plug of the load is fully seated in the female end of the tester, one of the prongs will bridge the gap between the terminal parts 38 and 40, so that the resistors 32 and 34 will be connected in parallel to one another and in series with the lamp 30. The lamp 30 is brightly illuminated once more. This indicates that the male plug has been fully seated in the female socket and that power is being supplied to the resistive load 36.

While one embodiment of the present invention has been described in the foregoing, it is to be understood that other embodiments are possible within the scope of the invention. The scope of the invention is to be ascertained solely by reference to the appended claims.

I claim:

1. A tester for an electrical outlet and a resistive load to be coupled thereto, said tester comprising:

first terminal means for connection to a first terminal of the outlet and a first terminal of the load;

second terminal means having a first terminal part for connection to a second terminal of the outlet and a second terminal of the load, and a second terminal part for connection to the second terminal of the load, the first and second terminal parts being positioned for sequential engagement of the second terminal part and the first terminal part with the second terminal of the load as the load is coupled to the tester;

first and second resistive means connected in series between the first and second terminal parts of the second terminal means; and indicator lamp means connected between the first and second resistors and to the first terminal means.

2. A tester for a conventional female electrical outlet having a pair of sockets and for a resistive load to be coupled to the outlet by a conventional male electrical plug having a pair of prongs engagable in the sockets of the outlet, said tester comprising:

a tester housing having opposed male and female ends;

first and second prongs projecting from the male end of the housing for engagement in the sockets of the outlet;

first and second sockets in the female end of the housing for receiving the prong of the male plug, the second socket having first and second terminal means electrically separated from one another and arranged in sequence in the socket with the first socket terminal means adjacent the female end of the housing and the second socket terminal means spaced towards the male end of the housing, the first socket being electrically connected to the first prong and the second terminal means being electrically connected to the second prong;

first circuit means comprising a lamp and a resistor electrically connected in series and means electrically connecting the lamp to the first prong and the resistor to the second prong; and second circuit means comprising a second resistor electrically connected to the first circuit means between the lamp and the first resistor and connected to the first terminal means of the second socket.

3. A tester according to claim 1 wherein the first terminal means comprise a first prong and a first socket electrically connected to one another, the second terminal means comprise a second prong and a second socket, the first and second terminal parts comprising aligned first and second parts of the second socket.

4. A tester according to claim 1 wherein the lamp means comprises a high resistance neon lamp.

5. A tester according to claim 1 wherein the lamp comprises a high resistance neon lamp.

6. A tester according to claim 1 wherein each of said first and second resistive means has a resistance less than the resistance of the lamp means.

7. A tester according to claim 2 wherein each of the first and second resistors has a resistance less than the resistance of the lamp.

8. A tester according to claim 4 wherein said first and second resistive means comprise resistors with the same resistance.

9. A tester according to claim 5 wherein said first and second resistors have the same resistance.

* * * * *